(12) United States Patent
Ervin et al.

(10) Patent No.: US 8,836,003 B2
(45) Date of Patent: Sep. 16, 2014

(54) LATERAL EPITAXIAL GROWN SOI IN DEEP TRENCH STRUCTURES AND METHODS OF MANUFACTURE

(71) Applicant: International Business Machines Corporation, Armonk, NY (US)

(72) Inventors: Joseph Ervin, Wappingers Falls, NY (US); Brian Messenger, Newburgh, NY (US); Karen A. Nummy, Newburgh, NY (US); Ravi M. Todi, Coste Jardin Del Mar, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/090,033

(22) Filed: Nov. 26, 2013

(65) Prior Publication Data

US 2014/0084418 A1    Mar. 27, 2014

Related U.S. Application Data

(60) Continuation of application No. 13/530,519, filed on Jun. 22, 2012, which is a division of application No. 12/916,864, filed on Nov. 1, 2010, now Pat. No. 8,232,163.

(51) Int. Cl.
*H01L 27/108* (2006.01)
*H01L 29/66* (2006.01)
*H01L 29/94* (2006.01)
*H01L 27/12* (2006.01)
*H01L 21/84* (2006.01)
*H01L 49/02* (2006.01)

(52) U.S. Cl.
CPC .......... *H01L 28/60* (2013.01); *H01L 29/66181* (2013.01); *H01L 29/945* (2013.01); *H01L 27/1203* (2013.01); *H01L 21/84* (2013.01)
USPC .................................... 257/301; 257/E29.346

(58) Field of Classification Search
USPC .................................... 257/296–307, E29.346
See application file for complete search history.

(56) References Cited

U.S. PATENT DOCUMENTS

| | | | |
|---|---|---|---|
| 6,107,135 A | 8/2000 | Kleinhenz et al. | |
| 6,163,045 A | 12/2000 | Mandelman et al. | |
| 6,340,615 B1 | 1/2002 | Iyer et al. | |
| 6,555,891 B1 | 4/2003 | Furukawa et al. | |
| 6,855,976 B2 * | 2/2005 | Nagano et al. | 257/305 |

(Continued)

OTHER PUBLICATIONS

J.A. Mandelman et al., "Challenges and future directions for the scaling of dynamic random-access memory (DRAM)," of Res. and Dev., vol. 46 No. 2/3, Mar./May 2002, pp. 187-212.

*Primary Examiner* — Matthew W Such
*Assistant Examiner* — Ali Naraghi
(74) *Attorney, Agent, or Firm* — Joseph Petrokaitis; Roberts Mlotkowski Safran & Cole, P.C.

(57) ABSTRACT

Deep trench capacitor structures and methods of manufacture are disclosed. The method includes forming a deep trench structure in a wafer including a substrate, buried oxide layer (BOX) and silicon (SOI) film. The structure includes a wafer including a substrate, buried insulator layer and a layer of silicon on insulator layer (SOI) having a single crystalline structure throughout the layer. The structure further includes a first plate in the substrate and an insulator layer in direct contact with the first plate. A doped polysilicon is in direct contact with the insulator layer and also in direct contact with the single crystalline structure of the SOI.

15 Claims, 5 Drawing Sheets

(56) References Cited

U.S. PATENT DOCUMENTS

| | | |
|---|---|---|
| 6,951,822 B2 | 10/2005 | Scholz |
| 7,012,289 B2 | 3/2006 | Popp et al. |
| 7,193,262 B2 | 3/2007 | Ho et al. |
| 7,550,359 B1 | 6/2009 | Cheng et al. |
| 7,575,970 B2 | 8/2009 | Ho et al. |
| 2003/0082884 A1* | 5/2003 | Faltermeier et al. .......... 438/387 |
| 2006/0202249 A1 | 9/2006 | Cheng et al. |
| 2007/0045698 A1* | 3/2007 | Cheng et al. ................... 257/301 |
| 2008/0083941 A1* | 4/2008 | Cheng et al. ................... 257/301 |
| 2008/0160713 A1* | 7/2008 | Cheng et al. ................... 438/386 |
| 2009/0173980 A1* | 7/2009 | Cheng et al. ................... 257/301 |
| 2009/0184356 A1* | 7/2009 | Brodsky et al. ................ 257/301 |
| 2009/0184392 A1 | 7/2009 | Cheng et al. |
| 2009/0230508 A1 | 9/2009 | Dyer et al. |
| 2009/0236691 A1 | 9/2009 | Duyer et al. |
| 2011/0049594 A1* | 3/2011 | Dyer et al. ..................... 257/296 |
| 2011/0169065 A1* | 7/2011 | Cheng et al. ................... 257/301 |

\* cited by examiner

LATERAL EPITAXIAL GROWN SOI IN DEEP TRENCH STRUCTURES AND METHODS OF MANUFACTURE

FIELD OF THE INVENTION

The invention relates to semiconductor structures and methods of manufacture and, more particularly, to deep trench capacitor structures and methods of manufacture.

BACKGROUND OF THE INVENTION

Dynamic Random Access Memory (DRAM) cells include a capacitor for storing charge. The capacitor can be coupled to a transistor (e.g., passive write gate or active write transistor) for transferring charge to and from the capacitor. Reducing the size of the cell is critical to advancing technology nodes. This reduction in size also determines speed, chip density, and cost of manufacture.

In past technologies nodes, cell reduction has been done, normally, by shrinking feature sizes to shrink the cell. However, in addition to shrinking the cell features, an effective way to reduce cell area is to reduce the largest feature in the cell, e.g., the area of the storage capacitor. One way to reduce DRAM cell size without reducing storage capacitance is to use trench capacitors in the cells.

Typically, trench capacitors are formed by etching long deep trenches in a silicon wafer, selectively doping the trench sidewalls, and coating the trench with a dielectric layer. The coated trench is then filled with polysilicon or amorphous silicon to form a vertical cell capacitor plate and, as a result, a cell capacitor on its side in the trench. Thus, the silicon surface "real estate" required for the storage capacitor is dramatically reduced without sacrificing capacitance.

For state of the art trench capacitor DRAM cells, a plate is formed in the sidewall of the trench, by doping the sidewall of the trench. In SOI technology, this doping can damage the sidewalls of the SOI film, which can affect the crystalline structure of the silicon (SOI). This damaged area typically forms the active region of the gate structure, i.e., transistor. Accordingly, due to the damage, the gate will have degraded performance characteristics, which is not desirable.

Accordingly, there exists a need in the art to overcome the deficiencies and limitations described hereinabove.

SUMMARY

In a first aspect of the invention, a method comprises forming a deep trench structure in a wafer comprising a substrate, buried oxide layer (BOX) and silicon (SOI) film. The method further comprises forming a plate on a sidewall of the deep trench structure in the substrate by an implant process. The implant processes contaminate exposed edges of the SOI film in the deep trench structure. The method further comprises removing the contaminated exposed edges of the SOI film by an etching process to form a void in the SOI film. The method further comprises growing epitaxial Si in the void, prior to completing a capacitor structure.

In another aspect of the invention, a method comprises etching a deep trench structure through a wafer comprising a substrate, buried oxide layer (BOX) and silicon (SOI) film. The method further comprises implanting a plate in the substrate, which contaminates exposed edges of the SOI film in the deep trench structure. The method further comprises forming an insulator liner on sidewalls of the deep trench structure, over the plate. The method further comprises removing the contaminated exposed edges of the SOI film by an etching process that widens the deep trench structure in the SOI film. The method further comprises growing epitaxial Si in the removed portion of the SOI film. The method further comprises forming a second plate over the insulator liner.

In a first aspect of the invention, a deep trench capacitor structure comprises a wafer comprising a substrate, buried insulator layer and a layer of silicon on insulator layer (SOI) having a single crystalline structure throughout the layer. The structure further comprises a first plate in the substrate. The structure further comprises an insulator layer in direct contact with the first plate. The structure further comprises a second doped of polysilicon in direct contact with the insulator layer and in direct contact with the single crystalline structure of the SOI.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the deep trench structure with single crystalline SOI, which comprises the structures of the present invention. In still further embodiments, a method in a computer-aided design system is provided for generating a functional design model of the deep trench structure with single crystalline SOI. The method comprises generating a functional representation of the structural elements of the deep trench structure with single crystalline SOI.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

The invention relates to semiconductor structures and methods of manufacture and, more particularly, to deep trench capacitor structures and methods of manufacture. More specifically, the invention relates to lateral epitaxial grown SOI in deep trench structures and methods of manufacture. In embodiments, the epitaxial grown SOI is an epitaxial silicon (Si) film grown in a hardmasked covered SOI structure. The epitaxial grown Si can be used to replace damaged or contaminated SOI, which occurred during plate implant of the deep trench (DT) structure. Accordingly, an application of the processes of the present invention is, in embodiments, an implanted plate for deep trench (DT) structures.

In implementation, a collar-less process can be used to etch the deep trench (DT) structure to maximize the critical dimension (CD) opening from the mask level. An implant for deep trench (DT) plate can follow which, in embodiments, contaminates the SOI, on its edges. In embodiments, the doped SOI material can be removed and replaced by lateral epitaxial material, i.e., epitaxial Si. In this way, advantageously, the epitaxial process of the present invention can regrow single crystalline Si that can be used for device wells, compared to conventional processes where the etched SOI is replaced with dielectric films or poly crystalline silicon. Also, in embodiments, by using the processes of the present invention, the critical dimension (CD) of the deep trench (DT) will not be impacted which, in turn, will not affect capacitance of the plate structure. That is, unlike in conventional processes, the critical dimension (CD) of the deep trench (DT) will not limit the deep trench (DT) structure depth and therefore capacitance.

Figure 1:
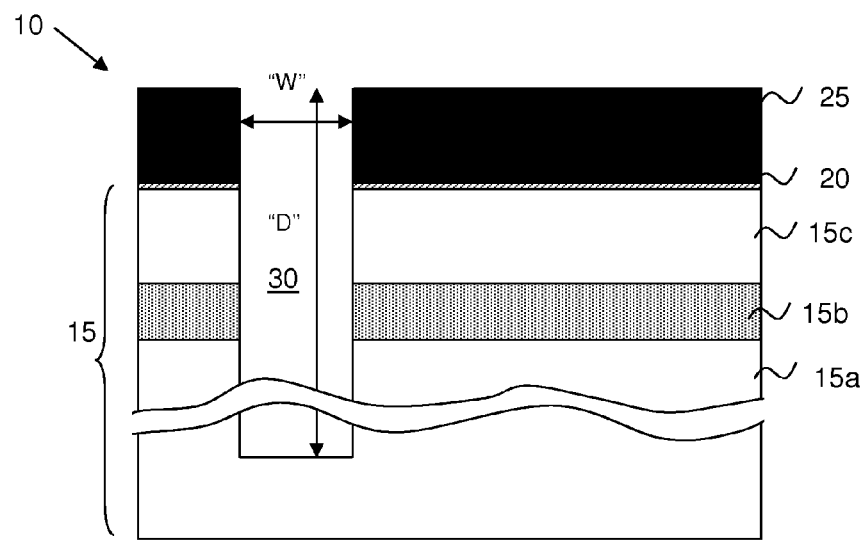
FIG. 1 shows a beginning structure and respective processing steps in accordance with aspects of the invention.

FIG. 1 shows a beginning structure and respective processing steps in accordance with aspects of the invention. More specifically, the beginning structure 10 includes a wafer 15. The wafer 15 includes, for example, a buried oxide layer (BOX) 15b between a silicon substrate 15a and silicon film (SOI) 15c. In embodiments, the BOX 15b can have, for example, a thickness of about 500 Å to 2500 Å; although other dimensions are also contemplated by the present invention. In embodiments, the SOI 15c can have a thickness of about 400 Å to 1000 Å and more specifically about 800 Å; although other dimensions are also contemplated by the present invention.

In embodiments, the beginning structure 10 further includes an insulator layer 20 and a hard mask 25. In embodiments, the insulator layer 20 may be, for example, pad oxide; however, other insulator layers are also contemplated by the present invention. In embodiments, the insulator layer 20 is a sacrificial layer, and can have a thickness of about 50 Å to 100 Å and more preferably about 80 Å. The hard mask 25 can be, for example, a two layer mask comprising a nitride film of about 1000 Å and an oxide film of about 10,000 Å; although other dimensions are also contemplated by the present invention.

In embodiments, a deep trench (DT) structure 30 is formed in the wafer 15, through the insulator layer 20 and hard mask 25. The deep trench (DT) structure 30 can be used, for example, as a capacitor in a DRAM (dynamic random access memory) or eDRAM. The deep trench (DT) structure 30 can be formed in any conventional manner such as, for example, lithography and etching processes.

For example, to form the deep trench (DT) structure 30, a resist (not shown) can be deposited on the hard mask 25, which is patterned by exposure to light using conventional lithographic processes. Once the resist is patterned with a critical dimension, an etching process is performed to form the deep trench (DT) structure 30. The etching process can be, for example, a reactive ion etch (RIE) using the appropriately known chemistries. The deep trench (DT) structure 30 is of a critical dimension and is formed into the underlying substrate 15a, e.g., below the SOI 15c and BOX 15b.

The deep trench (DT) structure 30, as should be understood by those of skill in the art, can be formed in two or more etching processes. For example, a reactive ion etch (RIE) etch step may be performed to extend the initial trench into the substrate 15a, so as to become a deep trench (DT) structure 30 suitable for use in conjunction with a cell transistor in a DRAM cell, for example. In embodiments, the RIE can also open the BOX 15b if it was not previously opened.

In embodiments, the additional RIE process will etch substantially vertically (i.e., directionally, anisotropically) into the substrate 15a. Directional RIE etching, for example, is relatively non-selective with regard to materials, and can etch through the BOX 15b (and thermal oxide covering the BOX, if any), and proceed to etch the substrate 15a. In embodiments, the deep trench (DT) structure 30 may have a width "W" of about 50 nm to 200 nm and a depth "D" of 1,000 nm to 10,000 nm, by way of example.

Figure 2:
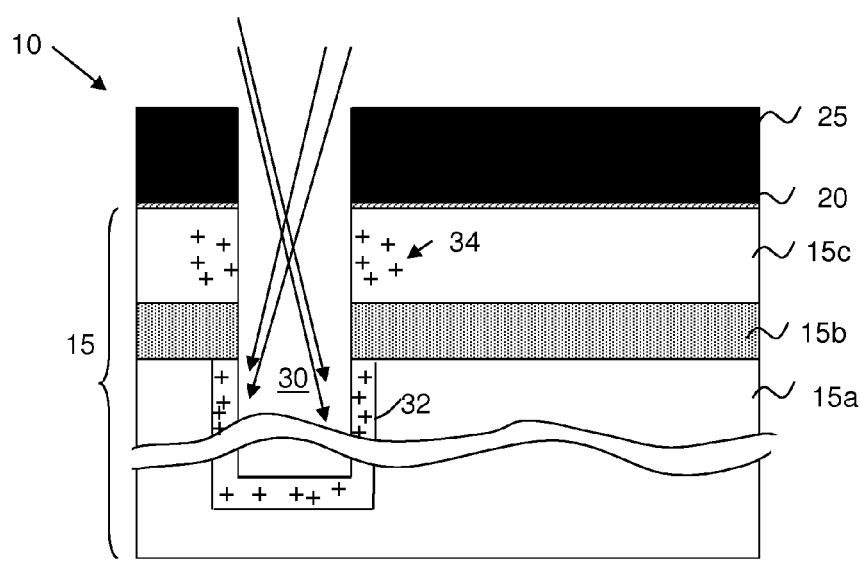
FIGS. 2-8 show additional processing steps and respective structures in accordance with aspects of the invention.

In FIG. 2, the deep trench (DT) structure 30 undergoes a plate implant process to form a capacitor plate 32. In embodiments, the implant process is a low angle implant through the sidewalls of the wafer 15, and more specifically in the BOX 15b and substrate 15a. The implant can be an N+ implant such as, for example, phosphorus or arsenic at a known dosage, concentration and time. During this implant process, though, the dopant contaminates the SOI 15c, on its edges 34, e.g., to a depth of about 5 nm to 10 nm depending on the energy level of the implant process. This, in turn, damages the ability of the SOI 15c to form a gate, e.g., be used as a well.

Figure 3:
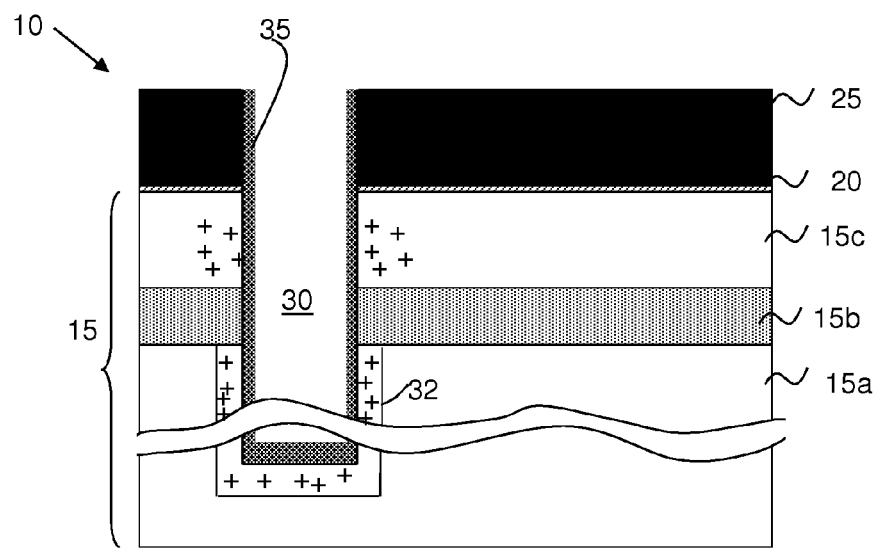

FIG. 3 shows the formation of a node dielectric in accordance with aspects of the present invention. For example, in FIG. 3, the deep trench (DT) structure 30 is lined with an insulator material 35. In embodiments, the insulator material 35 can be, for example, a dielectric collar such as nitride oxide, hafnium oxide or other high-k dielectric film (hereinafter referred to as "dielectric collar"), selective to the BOX 15b. In embodiments, the thickness of the dielectric collar 35 is about 40 Å to 50 Å, for example.

The dielectric collar 35 can be formed through conventional deposition methods such as, for example, an oxidation process or Atomic Layer Deposition (ALD). As should be understood by those of skill in the art, ALD is a thin film deposition process that is based on the sequential use of a gas phase chemical process. The majority of ALD reactions use precursors, which react with a surface in a sequential manner. By exposing the precursors to the growth surface repeatedly, a thin film is deposited.

Figure 4:
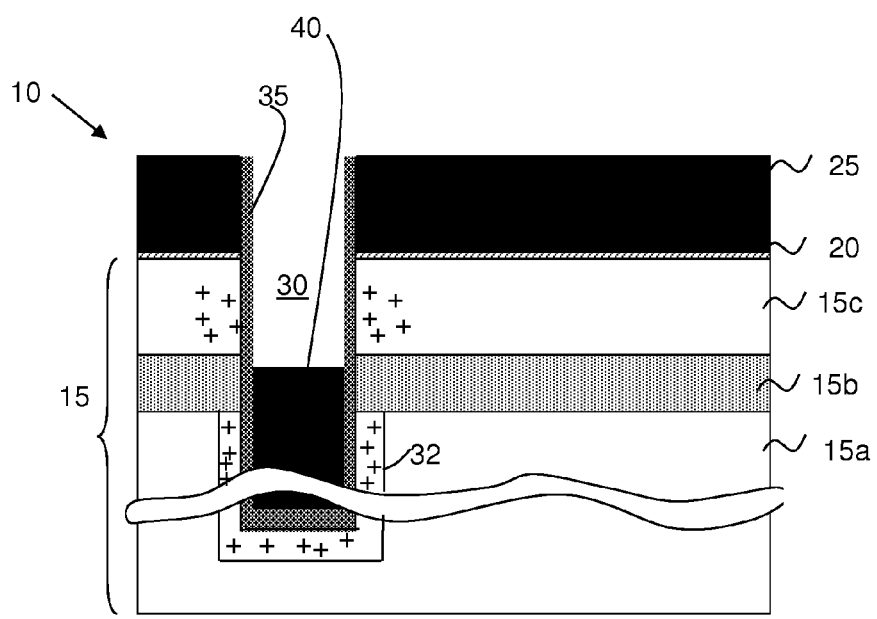

In FIG. 4, a resist film 40 is deposited in the deep trench (DT) structure 30. More specifically, the resist film 40 fills the deep trench (DT) structure 30 in order to protect or block the capacitor plate 32 during subsequent processes. In embodiments, the resist film 40 will also block part of the BOX 15b, but should leave exposed the SOI 15c.

Figure 5:
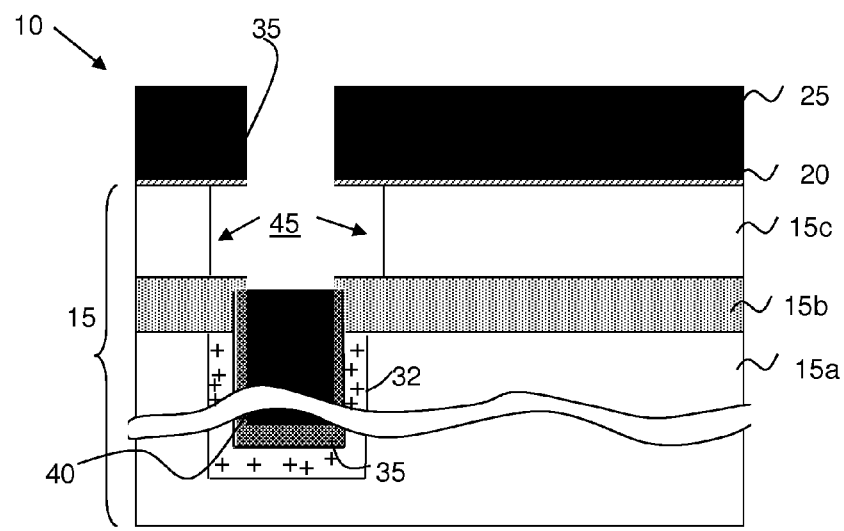

As shown in FIG. 5, a portion of the dielectric collar 35 is removed to expose the SOI 15c. For example, the dielectric collar 35 can be removed with a RIE process that includes chemistry selective to the dielectric collar 35. In this way, the RIE process will not affect or substantially affect the BOX 15b. Another RIE process is performed to remove the damaged portion (contaminated region 34) of the SOI 15c, leaving a space (void) 45. This RIE process effectively widens the deep trench (DT) structure at the SOI 15c, about equivalent to the depth of the contamination. This additional RIE process can be, for example, chlorine or bromine based chemistry, selective to the SOI film 15c. In embodiments, the additional RIE process will be selective to doped SOI such that the RIE will not affect or substantially affect the BOX 15b. In embodiments, the RIE process will remove about 5 nm to 10 nm or more of the SOI to remove the damaged (contaminated) portions.

Figure 6:
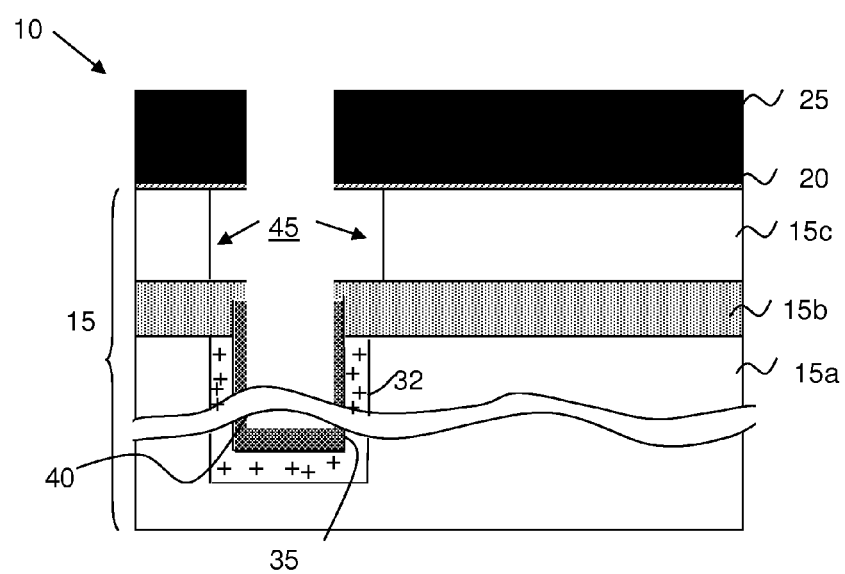

In FIG. 6, the resist film is removed using conventional processes. For example, the resist film can be removed by a plasma ashing process, e.g., $O_2$ ashing processes. In semiconductor manufacturing, plasma ashing is the process of removing the photoresist from an etched wafer using a reactive species. Oxygen or fluorine is the most common reactive species. The reactive species combines with the photoresist to form ash, which is removed with a vacuum pump.

Figure 7:
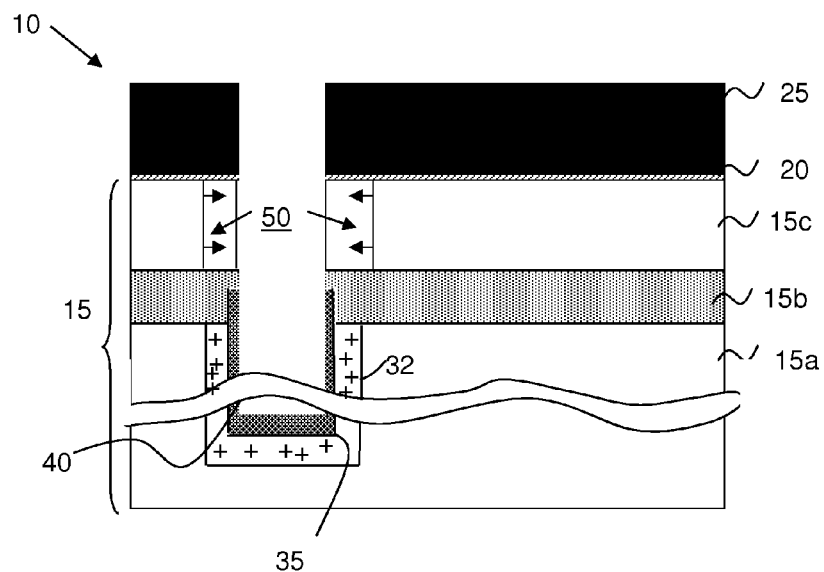

In FIG. 7, the removed/contaminated SOI is replaced by an epitaxial Si layer 50. In embodiments, the epitaxial Si layer 50 is grown in the space 45, using conventional processes. Advantageously, the epitaxial Si layer 50 will follow the already existing crystal plane of the SOI 15c. That is, the epitaxial Si layer 50 will follow the crystal structure of the SOI 15c, which results in a single crystalline SOI 15c. This is advantageous for gate formation. More specifically, the epitaxial Si layer 50 may be grown from gaseous or liquid precursors. Because the substrate acts as a seed crystal, the Si layer 50 takes on a lattice structure and orientation identical to that of the substrate, i.e., SOI 15c. In one illustrative example, the Si can be grown using vapor-phase epitaxy (VPE). This is different from other thin-film deposition methods which deposit polycrystalline or amorphous films, even on single-crystal substrates.

Figure 8:
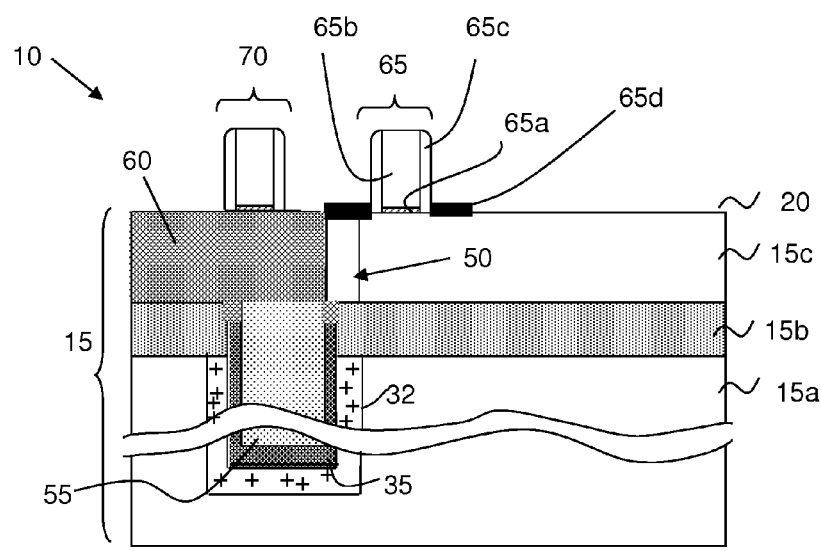

FIG. 8 shows back end of line (BEOL) processes and resulting structure in accordance with aspects of the invention. In the processes to form the structure of FIG. 8, the deep trench (DT) structure 30 is filled with a doped poly material 55. The doped poly material 55 can include, for example, arsenic or phosphorous dopant, which is formed over the dielectric collar 35. The doped poly material 55 will form a second plate of the capacitor structure. The doped poly material 55 can be etched back to the surface of the SOI 15c, and the insulator layer 20 and hard mask 25 can be then removed using conventional chemical mechanical polishing processes (CMP).

A shallow trench isolation structure (STI) 60 is formed using conventional lithographic, etching and deposition processes. For example, a resist is formed on the SOI 15c (and doped poly material 55) and patterned by exposure to light (e.g., forming openings). A RIE process is performed to form a trench, which is filled with oxide, for example, to form the STI 60.

An active word line gate 65 and passive word line gate 70 are formed on the SOI 15c and STI 60, respectively. The active word line gate 65 and passive word line gate 70 are formed by depositing a gate dielectric 65a and gate electrode 65b on the SOI 15c and the STI 60. The gate dielectric 65a can be, for example, any known gate dielectric material such as hafnium oxide, oxy nitride, or other high-k dielectric material. The gate electrode 65b can be a doped poly or metal gate, for example.

The gate dielectric 65a and gate electrode 65b are then patterned using conventional processes. Source and drain regions can be formed by conventional doping processes, with sidewall spacers 65c formed on the sidewalls of the gate structures. The sidewall spacers 65c can be, for example, oxide, nitride or a combination thereof. Silicide regions 65d are then formed for contacts to the source, drain and gate electrode.

Figure 9:
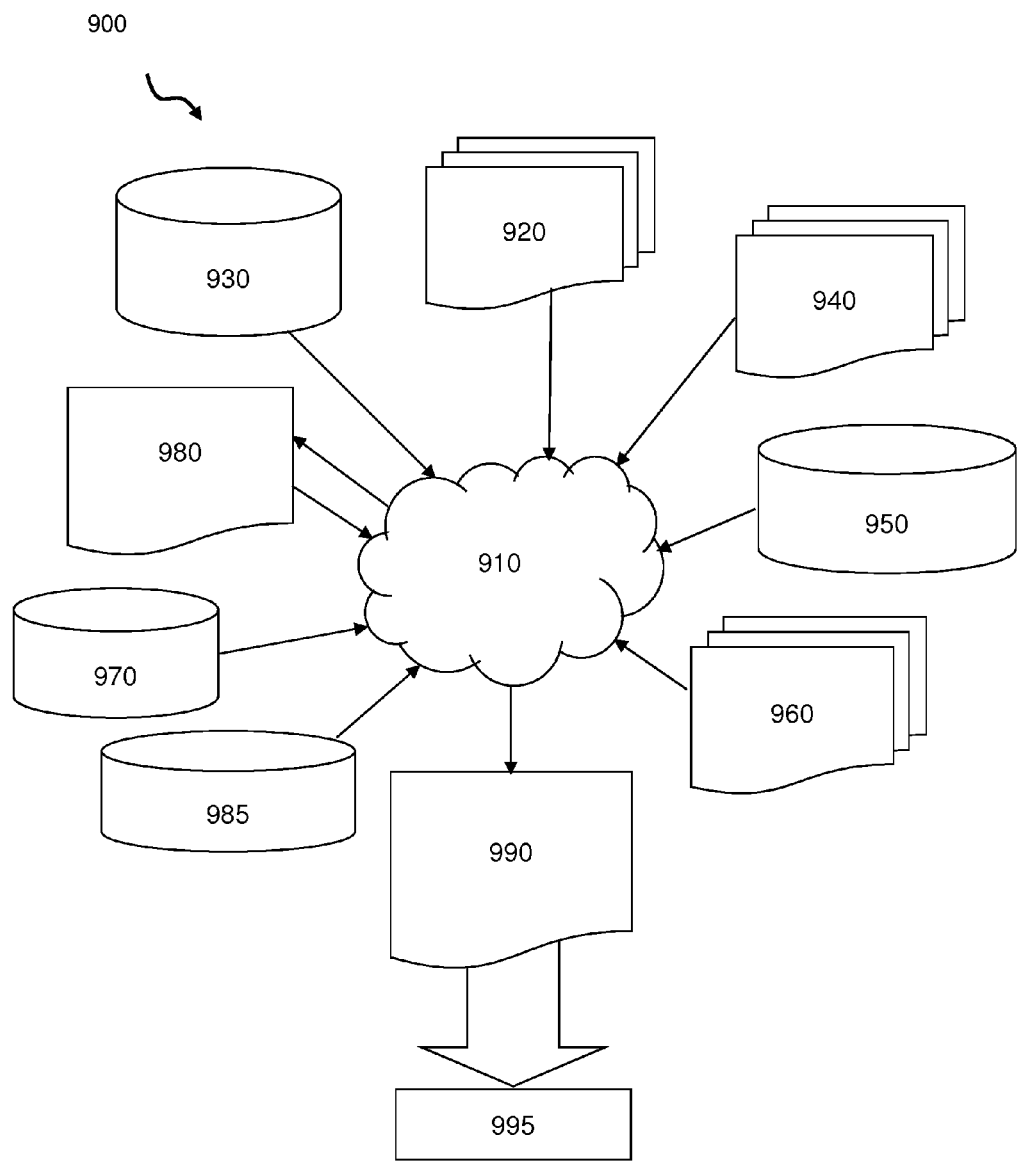
FIG. 9 is a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-8 to generate a netlist 980, which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985, which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 990 may comprise a compiled, executable HDL simulation model that functionally simulates the devices shown in FIGS. 1-8.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A deep trench capacitor structure comprising:
   a wafer comprising a substrate, buried insulator layer and a layer of silicon on insulator layer (SOI) having a single crystalline structure throughout the layer;
   a deep trench structure formed in the wafer and comprising a widened portion formed in the SOI;
   an epitaxial Si formed in and throughout the widened portion of the deep trench structure, which contacts and has a single crystalline structure that matches the single crystalline structure of the SOI;
   a first plate formed in the deep trench structure;
   an insulator layer in contact with the first plate;
   a doped polysilicon in contact with the insulator layer; and
   silicide regions formed on the SOI.

2. The structure of claim 1, wherein the first plate is on a sidewall of the deep trench structure in the substrate.

3. The structure of claim 1, wherein the insulator layer is a collar formed about sidewalls of the deep trench structure comprising an oxide based dielectric material.

4. The structure of claim 3, wherein the collar extends over only a portion of sidewalls of the buried insulator layer.

5. The structure of claim 1, wherein the doped polysilicon fills the deep trench structure.

6. The structure of claim 5, wherein the doped polysilicon completely fills the deep trench structure to form a second plate, and is planar with a surface of the SOI.

7. The structure of claim 5, wherein the doped polysilicon is planar with a bottom surface of the SOI.

8. The structure of claim 1, wherein the insulator layer is in direct contact with the first plate, and the doped polysilicon is in direct contact with the insulator layer.

9. The structure of claim, 1, wherein the deep trench structure has a width "W" of about 50 nm to 200 nm and a depth of 1,000 nm to 10,000 nm.

10. A structure, comprising:
   a deep trench structure through a wafer comprising a substrate, buried oxide layer (BOX) and silicon (SOI) film having a single crystalline structure throughout the SOI film, the deep trench structure comprising a widened portion in the SOI film;
   an implanted plate in the substrate;
   an insulator liner on sidewalls of the deep trench structure, over the implanted plate;
   epitaxial Si formed in the widened portion of the deep trench structure, which contacts and has a single crystalline structure that matches the single crystalline structure of the SOI film;
   a second plate over the insulator liner;
   a shallow trench structure formed over the deep trench structure and in direct contact with the epitaxial Si; and
   silicide regions formed on the silicon on the SOI film.

11. The structure of claim 10, wherein the second plate is a doped poly layer in the deep trench structure.

12. The structure of claim 10, wherein the insulator liner is a dielectric collar that is on the sidewalls of the deep trench structure.

13. The structure of claim 10, further comprising a passive word line gate on the shallow trench structure.

14. The structure of claim 13, further comprising an active word line gate on a surface of the SOI film, adjacent to the passive word line gate.

15. The structure of claim 10, wherein the epitaxial Si is formed throughout the widened portion of the deep trench structure.

* * * * *